US012614575B1

(12) United States Patent　　　　(10) Patent No.:　US 12,614,575 B1
Kanj　　　　　　　　　　　　　　　　(45) Date of Patent:　　Apr. 28, 2026

(54) HALF STATIC RANDOM ACCESS MEMORY (SRAM) CELL

(71) Applicant: Synopsys, Inc., Sunnyvale, CA (US)

(72) Inventor: Rouwaida Kanj, Cedar Park, TX (US)

(73) Assignee: Synopsys, Inc., Sunnyvale, CA (US)

( * ) Notice: Subject to any disclaimer, the term of this patent is extended or adjusted under 35 U.S.C. 154(b) by 109 days.

(21) Appl. No.: 18/463,133

(22) Filed: Sep. 7, 2023

(51) Int. Cl.
　　　*G11C 7/24*　　　(2006.01)
　　　*G11C 7/10*　　　(2006.01)
　　　*G11C 7/22*　　　(2006.01)

(52) U.S. Cl.
　　CPC ............. *G11C 7/24* (2013.01); *G11C 7/1069* (2013.01); *G11C 7/1096* (2013.01); *G11C 7/22* (2013.01)

(58) Field of Classification Search
　　CPC ....... G11C 7/24; G11C 7/1069; G11C 7/1096; G11C 7/22
　　See application file for complete search history.

(56) References Cited

U.S. PATENT DOCUMENTS

| 4,053,798 | A | * | 10/1977 | Koike | ..................... | G11C 14/00 |
| | | | | | | 327/192 |
| 4,316,264 | A | * | 2/1982 | Harari | ................... | G11C 11/419 |
| | | | | | | 365/154 |
| 4,376,986 | A | * | 3/1983 | Elmasry | .................. | G11C 11/39 |
| | | | | | | 365/159 |

| 6,992,915 | B2 | * | 1/2006 | Kang | ................. | H03K 19/0016 |
| | | | | | | 365/156 |
| 7,136,296 | B2 | * | 11/2006 | Luk | ........................ | G11C 11/413 |
| | | | | | | 365/175 |
| 10,475,793 | B2 | * | 11/2019 | Huang | ................. | H10D 84/859 |

OTHER PUBLICATIONS

Chesney, S., et al., "Machine Learning Algorithms for Preventing IoT Cybersecurity Attacks," In: Arai, K., Kapoor, S., Bhatia, R. (eds) Intelligent Systems and Applications. IntelliSys 2020. Advances in Intelligent Systems and Computing, vol. 1252, pp. 679-686, 2021, Springer, Cham. https://doi.org/10.1007/978-3-030-55190-2_53.
Juang, P., et al., "Implementing Decay Techniques using 4T Quasi-Static Memory Cells" in IEEE Computer Architecture Letters, vol. 1, No. 01, pp. 10, 2002.doi: 10.1109/L-CA.2002.5.
Lim, D., et al., "Extracting secret keys from integrated circuits," in IEEE Transactions on Very Large Scale Integration (VLSI) Systems, vol. 13, No. 10, pp. 1200-1205, Oct. 2005, doi: 10.1109/TVLSI.2005.859470.

(Continued)

*Primary Examiner* — Vanthu T Nguyen
(74) *Attorney, Agent, or Firm* — Davenport IP Law, PLLC

(57)　　　　　　ABSTRACT

An example is a method. A first logical value is written to a latch node of a latch circuit of a half static random access memory (SRAM) cell. A second logical value is read from the latch node. The latch circuit is non-inverter-based. The latch circuit includes a p-type transistor and an n-type transistor. A drain node of the p-type transistor is electrically connected to a gate node of the n-type transistor, and a drain node of the n-type transistor is electrically connected to a gate node of the p-type transistor. According to some examples, the half SRAM cell may be implemented as a storage node, for a physical unclonable function (PUF), and/or for data padding.

20 Claims, 11 Drawing Sheets

(56) References Cited

OTHER PUBLICATIONS

R, S. et al., "Design and Analysis of a New Loadless 4T SRAM Cell in Deep Submicron CMOS Technologies," 2009 Second International Conference on Emerging Trends in Engineering & Technology, Nagpur, India, 2009, pp. 155-161, doi: 10.1109/ICETET.2009. 67.

Raachini, A. M. E., et al., "Double error cellular automata-based error correction with skip-mode compact syndrome coding for resilient PUF design," 2018 19th International Symposium on Quality Electronic Design (ISQED), Santa Clara, CA, USA, 2018, pp. 413-418, doi: 10.1109/ISQED.2018.8357322.

* cited by examiner

200

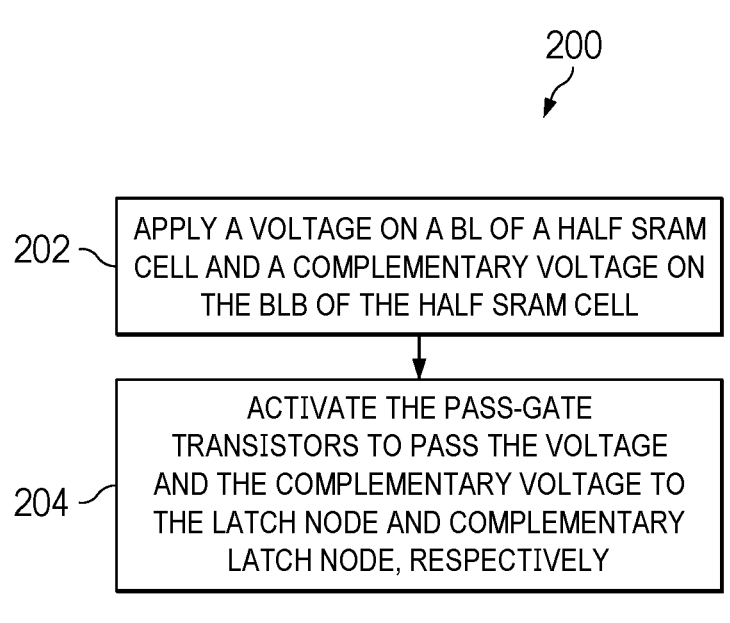

202 — APPLY A VOLTAGE ON A BL OF A HALF SRAM CELL AND A COMPLEMENTARY VOLTAGE ON THE BLB OF THE HALF SRAM CELL

204 — ACTIVATE THE PASS-GATE TRANSISTORS TO PASS THE VOLTAGE AND THE COMPLEMENTARY VOLTAGE TO THE LATCH NODE AND COMPLEMENTARY LATCH NODE, RESPECTIVELY

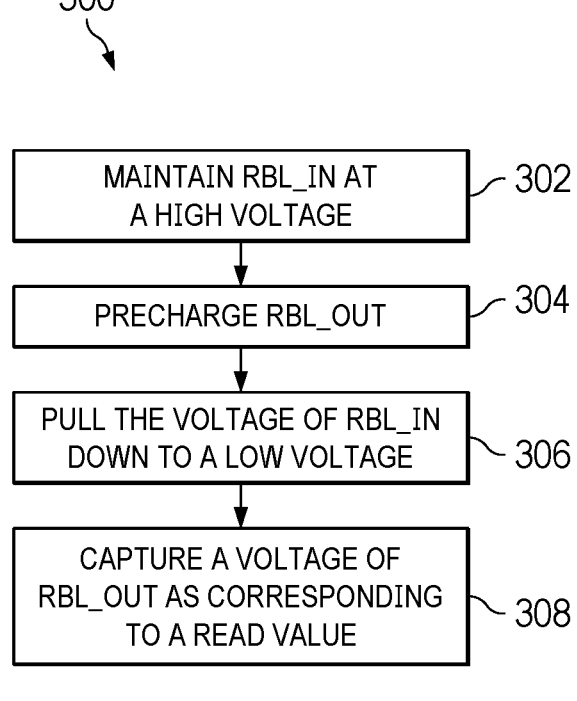

MAINTAIN RBL_IN AT A HIGH VOLTAGE — 302

PRECHARGE RBL_OUT — 304

PULL THE VOLTAGE OF RBL_IN DOWN TO A LOW VOLTAGE — 306

CAPTURE A VOLTAGE OF RBL_OUT AS CORRESPONDING TO A READ VALUE — 308

502 — OBTAIN ROW ADDRESS OF AN ARRAY OF HALF SRAM CELLS FROM AT LEAST PART OF A CHALLENGE

504 — WRITE LOGICAL "0"s TO THE HALF SRAM CELLS AT THE ROW INDICATED BY THE ROW ADDRESS

506 — READ THE HALF SRAM CELLS AT THE ROW INDICATED BY THE ROW ADDRESS AT A READ TIME (Tread) AFTER WRITING THE LOGICAL "0", WHERE THE READ DATA IS THE RESPONSE

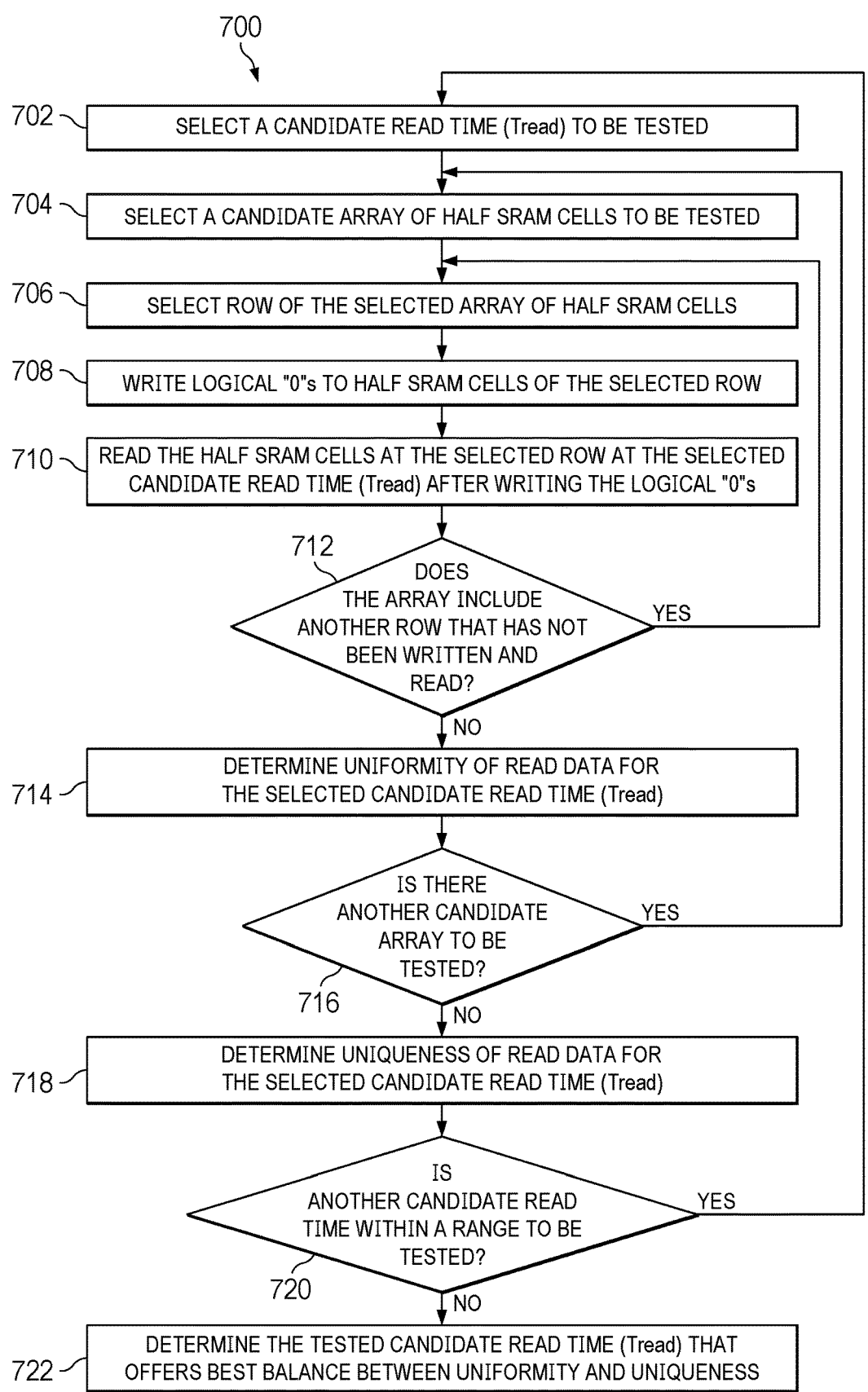

700

702 — SELECT A CANDIDATE READ TIME (Tread) TO BE TESTED

704 — SELECT A CANDIDATE ARRAY OF HALF SRAM CELLS TO BE TESTED

706 — SELECT ROW OF THE SELECTED ARRAY OF HALF SRAM CELLS

708 — WRITE LOGICAL "0"s TO HALF SRAM CELLS OF THE SELECTED ROW

710 — READ THE HALF SRAM CELLS AT THE SELECTED ROW AT THE SELECTED CANDIDATE READ TIME (Tread) AFTER WRITING THE LOGICAL "0"s

712 — DOES THE ARRAY INCLUDE ANOTHER ROW THAT HAS NOT BEEN WRITTEN AND READ?

YES

NO

714 — DETERMINE UNIFORMITY OF READ DATA FOR THE SELECTED CANDIDATE READ TIME (Tread)

IS THERE ANOTHER CANDIDATE ARRAY TO BE TESTED?

716

YES

NO

718 — DETERMINE UNIQUENESS OF READ DATA FOR THE SELECTED CANDIDATE READ TIME (Tread)

IS ANOTHER CANDIDATE READ TIME WITHIN A RANGE TO BE TESTED?

720

YES

NO

722 — DETERMINE THE TESTED CANDIDATE READ TIME (Tread) THAT OFFERS BEST BALANCE BETWEEN UNIFORMITY AND UNIQUENESS

FIG. 7

HALF STATIC RANDOM ACCESS MEMORY (SRAM) CELL

TECHNICAL FIELD

The present disclosure generally relates to an electronic circuit. In particular, the present disclosure relates to a half static random access memory (SRAM) cell.

BACKGROUND

A physical unclonable function (PUF) may leverage physical attributes of an underlying circuit. A PUF may output a unique response based on an input challenge under certain environmental conditions. A PUF may be implemented in applications where a high level of security is required due to the difficulty in reproducing a response of the PUF by another circuit or other attack technique.

SUMMARY

An example is a method. A first logical value is written to a latch node of a latch circuit of a half static random access memory (SRAM) cell. A second logical value is read from the latch node. The latch circuit is non-inverter-based. The latch circuit includes a p-type transistor and an n-type transistor. A drain node of the p-type transistor is electrically connected to a gate node of the n-type transistor, and a drain node of the n-type transistor is electrically connected to a gate node of the p-type transistor.

Another example is a system. The system includes a memory, a half SRAM cell, and a processor. The memory stores instructions. The half SRAM cell includes a latch circuit, and the latch circuit is non-inverter-based. The processor is coupled with the memory and is configured to execute the instructions. The instructions when executed cause the processor to append a logical value stored on a latch node of the latch circuit to data. Appending the logical value stored on the latch node includes remapping an address of the half SRAM cell.

A further example is a non-transitory storage medium storing an electronic representation of a circuit design. The circuit design includes a half SRAM cell that includes a latch circuit. The latch circuit is non-inverter-based. The latch circuit includes a p-type transistor and an n-type transistor. A drain node of the p-type transistor is electrically connected to a gate node of the n-type transistor. A drain node of the n-type transistor is electrically connected to a gate node of the p-type transistor.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 2 is a flowchart of a method for performing a write operation on the half SRAM cell of FIG. 1 according to some examples.

FIG. 3 is a flowchart of a method for performing a read operation on the half SRAM cell of FIG. 1 according to some examples.

FIG. 7 is a flowchart of a method of determining a read time (Tread) for multiple arrays of half SRAM cells of FIG. 4 for a PUF operation according to some examples.

DETAILED DESCRIPTION

Figure 1:
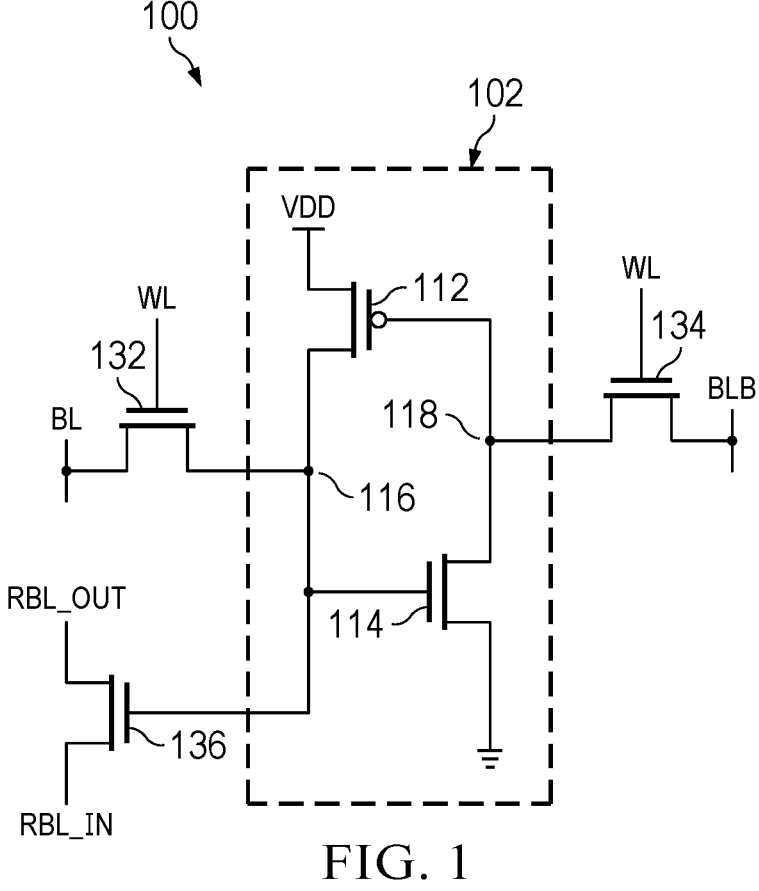
FIG. 1 is a circuit schematic of a half static random access memory (SRAM) cell according to some examples.

Aspects of the present disclosure relate to a half static random access memory (SRAM) cell. More particularly, aspects of the present disclosure relate to a half SRAM cell and applications of half SRAM cells, such as for a physical unclonable function (PUF) and padding for a data block.

With surging hardware security concerns, PUFs are an attractive security primitive for combatting cyberattacks. Inverter-based SRAM based PUFs may rely on an initialization bit as a response. However, such an inverter-based SRAM is subject to instability due to environmental conditions and other challenges such as sensitivity to a power supply ramp, and inverter-based SRAM cells are subject to data remanence issues when operating at cold temperatures, which render the cells susceptible to pre-erasure and post-erasure attacks.

As described herein, a half SRAM cell includes a latch circuit. The latch circuit includes an n-type transistor and a p-type transistor. A drain node of the p-type transistor is electrically connected to a gate node of the n-type transistor, and a drain node of the n-type transistor is electrically connected to a gate node of the p-type transistor. A source node of the p-type transistor is electrically connected to a positive power supply node, and a source node of the n-type transistor is electrically connected to a negative power supply node. The half SRAM cell may be formed of five transistors and may be area efficient.

The half SRAM cell may be a versatile solution for SRAM-type memories with expanded functionality. At low temperatures and in other low leakage regimes, a half SRAM cell may be implemented as a storage bitcell. The half SRAM cell may have a time-to-flip at relatively low temperatures and in other relatively low leakage regimes, which may permit the half SRAM cell to be implemented in a PUF. Variability, such as random process variations, may result in variability of time-to-flip for multiple half SRAM cells. The variability of the time-to-flip may be leveraged in a PUF by selecting a read time of the multiple half SRAM cells to obtain a response. The selected read time may be tuned (e.g., to account for environmental variations) to obtain a target uniformity and uniqueness of the PUF.

At room temperature or higher temperatures, the half SRAM cell may be biased toward a logical value, and hence may act as a stuck-at bit suitable for data padding, such as for machine learning application, via simple address mapping. In such situations, no additional writing of the half SRAM cell would be required, and hence, write delays may be avoided. The half SRAM cells may also qualify for dummy bits padding for security applications involving identification (ID) or key bit address hashing, such as where two parties share a secret virtual address map with the dummy bits infiltrating the physical address sequences.

Technical advantages of the present disclosure include, but are not limited to, an area efficient half SRAM cell that may have versatile functionality. The half SRAM cell may be implemented as a storage bitcell that has reduced area compared to an inverter-based SRAM cell. The half SRAM cell may be implemented in a PUF that avoids remanence issues of inverter-based SRAM-based PUFs. This may qualify the half SRAM cell to be used for security applications, especially for designs where data is at high risk, such as portable devices. Additionally, the half SRAM cell may be implemented for data padding with no additional write time. Other advantages and benefits may be achieved by various examples.

FIG. 1 is a circuit schematic of a half SRAM cell 100 according to some examples. The half SRAM cell 100 includes a latch circuit 102. The latch circuit 102 is not inverter-based. The latch circuit 102 does not include an inverter. The latch circuit 102 of the half SRAM cell 100 has two transistors-a p-type transistor 112 and an n-type transistor 114.

In the latch circuit 102, a source node of the p-type transistor 112 is electrically connected to a positive power supply node VDD. A drain node of the p-type transistor 112 is electrically connected to a gate node of the n-type transistor 114, which is also a latch node 116. A drain node of the n-type transistor 114 is electrically connected to a gate node of the p-type transistor 112, which is also a complementary latch node 118. A source node of the n-type transistor 114 is electrically connected to a negative power supply node (e.g., ground). The p-type transistor 112 may be considered a pull-up transistor, and the n-type transistor 114 may be considered a pull-down transistor. The drain node of the p-type transistor 112 is not electrically connected to a drain node of an n-type transistor that has a source node electrically connected to the negative power supply node. The drain node of the n-type transistor 114 is not electrically connected to a drain node of a p-type transistor that has a source node electrically connected to the positive power supply node.

The half SRAM cell 100 includes n-type transistors 132, 134. A first source/drain node of the n-type transistor 132 is electrically connected to a bit line node BL, and a second source/drain node of the n-type transistor 132 is electrically connected to the latch node 116. A gate node of the n-type transistor 132 is electrically connected to a word line node WL. A first source/drain node of the n-type transistor 134 is electrically connected to a complementary bit line node BLB, and a second source/drain node of the n-type transistor 134 is electrically connected to the complementary latch node 118. The BL and BLB are, at least in a write operation, maintained at complementary voltages (e.g., when one is at a logic high voltage, the other is at a logic low voltage, and vice versa). A gate node of the n-type transistor 134 is electrically connected to the word line node WL. The n-type transistors 132, 134 may be considered pass-gate transistors.

The half SRAM cell 100 includes an n-type transistor 136. A gate node of the n-type transistor 136 is electrically connected to the latch node 116. A first source/drain node of the n-type transistor 136 is electrically connected to a read bit line out node RBL_OUT, and a second source/drain node of the n-type transistor 136 is electrically connected to a read bit line in node RBL_IN. The n-type transistor 136 may be considered a read access transistor. In other examples, the gate node of the n-type transistor 136 may be electrically connected to the complementary latch node 118 instead of the latch node 116. In still other examples, the half SRAM cell may include the n-type transistor 136 electrically connected as shown in FIG. 1 and another n-type transistor having a gate node electrically connected to the complementary latch node 118. The other n-type transistor may have a first source/drain node electrically connected to a complementary read bit line out node BRBL_OUT and a second source/drain node electrically connected to the read bit line in node RBL_IN.

FIG. 2 is a flowchart of a method 200 for performing a write operation on the half SRAM cell 100 of FIG. 1 according to some examples. At 202, a voltage (e.g., to be written, such as a high voltage (e.g., hereinafter a logical "1") or a low voltage (e.g., hereinafter a logical "0")) is applied on the BL of the half SRAM cell 100, and a complementary voltage is applied on the BLB of the half SRAM cell 100. At 204, the pass-gate transistors (e.g., n-type transistors 132, 134) are activated by a voltage on the WL to pass the voltage on the BL and the complementary voltage on the BLB to the latch node 116 and the complementary latch node 118, respectively. The pass-gate transistors (e.g., n-type transistors 132, 134) may be activated when the WL is activated.

FIG. 3 is a flowchart of a method 300 for performing a read operation on the half SRAM cell 100 of FIG. 1 according to some examples. In the illustrated example, a read operation is performed from the latch node 116. At 302, RBL_IN is maintained at a high voltage during non-read operation, and at 304, RBL_OUT is precharged. At 306, RBL_IN is pulled down to a low voltage (e.g., pulsed low) in a read operation. At 308, a voltage of RBL_OUT is captured corresponding to a read value. When RBL_IN is pulled down in a read operation, if a logical "1" is stored on the latch node 116, the n-type transistor 136 is activated to a conducting state, and RBL_OUT is discharged to a low voltage, which is captured as read data indicating the logical "1". Further, when RBL_IN is pulled down in a read operation, if a logical "0" is stored on the latch node 116, the n-type transistor 136 is not activated to a conducting state (e.g., remains in a non-conducting state), and RBL_OUT maintains the precharged high voltage, which is captured as read data indicating the logical "0". In other examples, a read operation may be performed from the complementary latch node 118 (e.g., when the gate node of the n-type transistor 136 is electrically connected to the complementary latch node 118) using the same technique.

The latch circuit 102 is generally bistable and capable of storing two logic states in the absence of leakage or noise. When a logical "1" is passed through the n-type transistor 132 to the latch node 116 and a logical "0" is passed through the n-type transistor 134 to the complementary latch node 118, the p-type transistor 112 may continue to pull the latch node 116 up to a logical "1", and the n-type transistor 114 may continue to pull the complementary latch node 118 down to a logical "0". In such a situation, both of the p-type transistor 112 and the n-type transistor 114 are in conducting (e.g., on) states, which pulls the voltage of the latch node 116 up to the voltage of the positive power supply node VDD, and pulls the voltage of the complementary latch node 118 down to the voltage of the negative power supply node (e.g., ground).

The n-type transistor 132 may pass a strong logical "0" from the BL to the latch node 116, and the n-type transistor 134 may pass a strong logical "1" from the BLB to the complementary latch node 118. In the absence of leakage, the latch circuit 102 may maintain the logical "0" on the latch node 116 and the logical "1" on the complementary latch node 118, e.g., due to inherent capacitances of the p-type transistor 112 and the n-type transistor 114.

At relatively cold temperatures (such as in a range from 77 Kelvin (K) to 150 K) and other low leakage regimes, a logical "0" written to the latch node 116 may be disturbed by leakage. With low leakage, the voltage of the latch node 116 may increase towards the voltage of the positive power supply node VDD and with sufficient leakage, flip to a logical "1", such as when the voltage of the latch node 116 exceeds the threshold voltage of the n-type transistor 114. A time from writing a logical "0" at the latch node 116 to flipping the voltage of the latch node 116 to a logical "1" may be appreciable. Hence, in such circumstances, the half SRAM cell 100 may be implemented as a storage node and/or for a physical unclonable function (PUF) operation. Although various examples described herein use or leverage the flipping from a logical "0" to a logical "1" on the latch node 116, the corresponding flipping from a logical "1" to a logical "0" on the complementary latch node 118 may be used in other examples since the flipping on the complementary latch node 118 is a correlated event with the flipping on the latch node 116.

A time-to-flip (Tf) (e.g., the time from writing a logical "0" at the latch node 116 to flipping the voltage of the latch node 116 to a logical "1") may vary based on process, voltage, and temperature (PVT) variation. PVT variation affects leakage, which in turn affects how quickly the voltage of the latch node 116 flips. Regarding voltage variation, the time-to-flip (Tf) may have an exponential decay with increasing voltage of the positive power supply node VDD. More generally, the time-to-flip (Tf) decreases with increasing voltage of the positive power supply node VDD. Simulations of the half SRAM cell 100 were performed in which operation of the half SRAM cell 100 was at the temperature of 77 K, a write operation was assisted with a negative bitline boost and wordline boost of 0.15 V each, and the transistors of the half SRAM cell 100 were a minimum size for the technology node. The latch node 116 was written with a logical "0", and the time-to-flip (Tf) was measured. With a positive power supply voltage VDD of 0.18 V, the time-to-flip (Tf) was 2.2 ms. With a positive power supply voltage VDD of 0.25 V, the time-to-flip (Tf) was 860 µs. With a positive power supply voltage VDD of 0.3 V, the time-to-flip (Tf) was 320 µs. With a positive power supply voltage VDD of 0.4 V, the time-to-flip (Tf) was 40 µs.

The time-to-flip (Tf) decreases with increasing operating temperature. Simulations of the half SRAM cell 100 were performed in which operation of the half SRAM cell 100 was in a temperature range from 67 K to 147 K. At a first technology node for a semiconductor manufacturing process, the time-to-flip (Tf) was as follows: 5.2 milliseconds (ms) at 67 K; 2.2 ms at 77 K; 250 microseconds (µs) at 87 K; 31 µs at 97 K; 5.3 µs at 107 K; 1.2 µs at 117 K; 340 nanoseconds (ns) at 127 K; 119 ns at 137 K; and 47 ns at 147 K. At a second technology node, the time-to-flip (Tf) was as follows: 18.5 µs at 67 K; 9 µs at 77 K; 2.5 µs at 87 K; 590 ns at 97 K; 170 ns at 107 K; 58 ns at 117 K; 23 ns at 127 K; 11 ns at 137 K; and 6 ns at 147 K. At a third technology node, the time-to-flip (Tf) was as follows: 1.8 µs at 67 K; 320 ns at 77 K; 78 ns at 87 K; 25 ns at 97 K; 10 n ns at 107 K; 5.3 ns at 117 K; 3.2 ns at 127 K; 2.3 ns at 137 K; and 1.9 ns at 147 K.

Since the inherent process variation (e.g., dopant variation, channel length variation, gate dielectric thickness variation, etc.) effects in the half SRAM cell 100 are random by nature, the half SRAM cell 100 may be implemented for a PUF operation. The random variability of the time-to-flip (Tf) of the half SRAM cell 100 due to, e.g., process variation may be leveraged by implementing a number of half SRAM cells 100 for a PUF operation that may be irreproducible.

Figure 4:
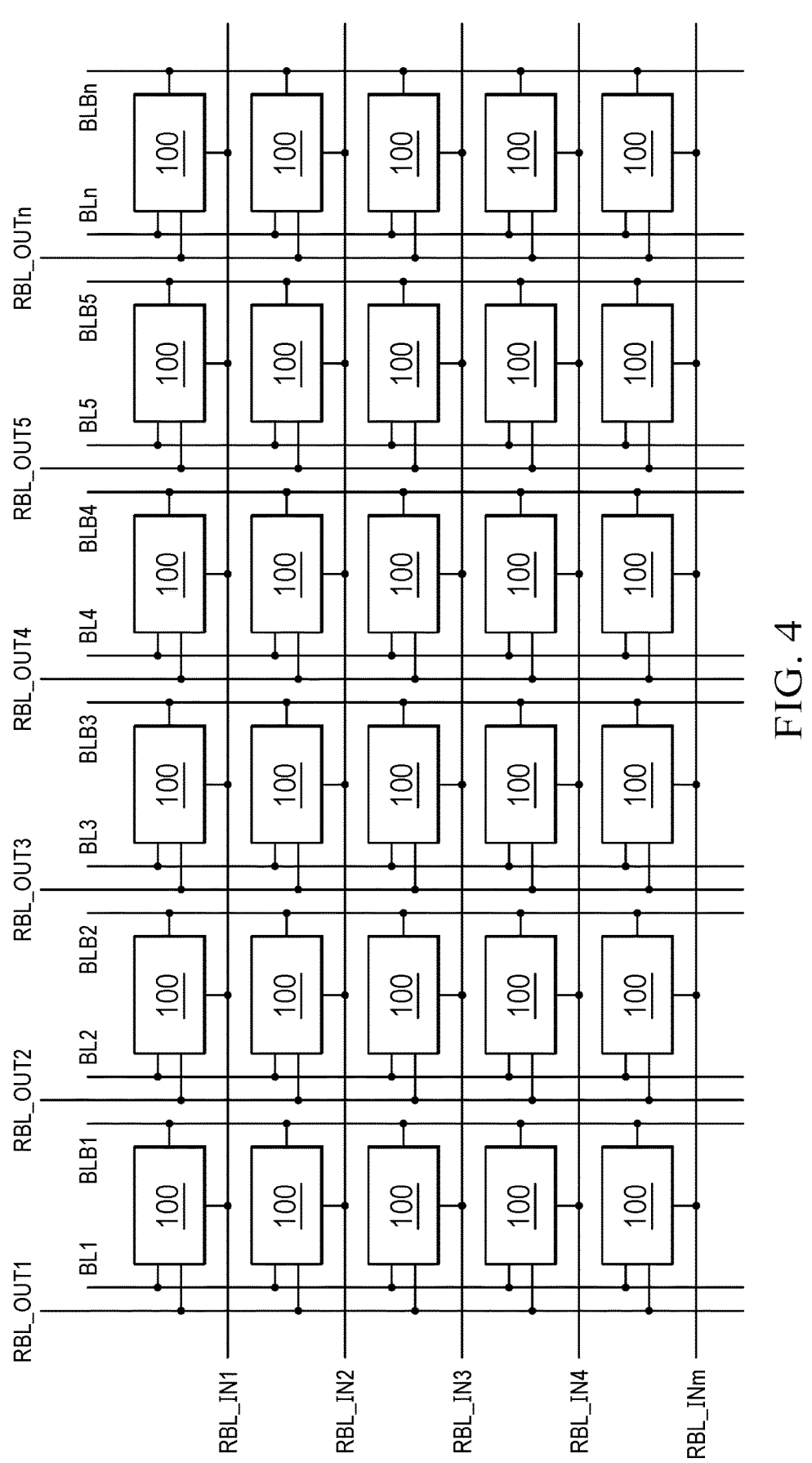
FIG. 4 is a circuit schematic of an array of half SRAM cells according to some examples.

FIG. 4 is a circuit schematic of an array of half SRAM cells 100 according to some examples. The array includes m rows and n columns of half SRAM cells 100 (e.g., includes m×n number of half SRAM cells 100). The BLs of the half SRAM cells 100 in a column are electrically connected to a same respective BL. For example, the BLs of the half SRAM cells 100 in a first column are electrically connected to a BL1; the BLs of the half SRAM cells 100 in a second column are electrically connected to a BL2; and the BLs of the half SRAM cells 100 in an nth column are electrically connected to a BLn. Similarly, the BLBs of the half SRAM cells 100 in a column are electrically connected to a same respective BLB. Although not illustrated, WLs of the half SRAM cells 100 in a row are electrically connected to a same respective WL.

The RBL_OUTs of the half SRAM cells 100 in a column are electrically connected to a same respective RBL_OUT. For example, the RBL_OUTs of the half SRAM cells 100 in a first column are electrically connected to an RBL_OUT1; the RBL_OUTs of the half SRAM cells 100 in a second column are electrically connected to an RBL_OUT2; and the RBL_OUTs of the half SRAM cells 100 in an nth column are electrically connected to an RBL_OUTn. The RBL_INs of the half SRAM cells 100 in a row are electrically connected to a same respective RBL_IN. For example, the RBL_INs of the half SRAM cells 100 in a first row are electrically connected to an RBL_IN1; the RBL_INs of the half SRAM cells 100 in a second row are electrically connected to an RBL_IN2; and the RBL_INs of the half SRAM cells 100 in an $m^{th}$ row are electrically connected to an RBL_INm.

To write a given half SRAM cell 100 in an i row and j column, like described with respect to FIG. 2, the BLj is maintained at the logical value (e.g., a logical "0" or "1") to be written to the latch node 116 of the respective half SRAM cell 100, and the BLBj is maintained at the complementary logical value. The respective logical values are passed from the BLj and BLBj through the n-type transistors 132, 134 to the latch node 116 and complementary latch node 118 when the WLi is activated. Various subsets of the half SRAM cells 100 of the array may be written simultaneously, such as a row of half SRAM cells 100 of the array. For example, to write a row of half SRAM cells 100, appropriate logical values to be written to the half SRAM cells 100 of the row are applied to the BLs and BLBs of the columns of the array, and the WL of the row is activated to cause the logical values of the BLs and BLBs to be passed to the latch nodes 116 and complementary latch nodes 118 of the half SRAM cells 100 of that row.

To read a given half SRAM cell 100 in an i row and j column, like described with respect to FIG. 3, RBL_INi is pulled down. If a logical "1" is stored on the latch node 116 of the half SRAM cell 100, RBL_OUTj is discharged to a low voltage, which is captured as read data indicating the logical "1". If a logical "0" is stored on the latch node 116, RBL_OUTj maintains a precharged high voltage, which is captured as read data indicating the logical "0". Various subsets of the half SRAM cells 100 of the array may be read simultaneously, such as a row of half SRAM cells 100 of the array. For example, to read a row of half SRAM cells 100, the RBL_IN of that row is pulled down, and voltages of the RBL_OUTs of the columns are captured as read data read from the row.

The writing and reading of one or multiple half SRAM cells 100 may be performed using a memory controller, which may further be controlled by a processing device (e.g., a processor). The processing device may, by execution of instructions stored in a non-transitory computer-readable storage medium, initiate an operation that causes the memory controller to read or write the half SRAM cells 100.

Some examples of the half SRAM cell 100 of FIG. 1 and/or the array of half SRAM cells 100 of FIG. 4 may be embodied as an intellectual property (IP) core (e.g., a digital or electronic representation) stored in a non-transitory computer-readable storage medium (e.g., memory). The IP core may be any appropriate representation, such as a netlist, a representation of a physical layout, or the like. For example, a circuit design including one or more half SRAM cells 100 may be embodied as an IP core stored in a non-transitory computer-readable storage medium. Further, for example, a circuit design including an array of half SRAM cells 100 may be embodied as an IP core stored in a non-transitory computer-readable storage medium. A user may be provided access to the IP core stored in the non-transitory computer-readable storage medium. The user can incorporate the IP core into a user design with or without modification to the IP core. For example, a user may download or otherwise obtain the IP core (including the design including the write assist circuit) onto a computing system that implements an electronic design automation (EDA) environment, and may incorporate the IP core into another design using the EDA environment. Examples of non-transitory computer-readable storage medium include RAM (e.g., static RAM (SRAM) and dynamic RAM (DRAM)), read only memory (ROM), programmable ROM (PROM), erasable programmable ROM (EPROM), electrically erasable programmable ROM (EEPROM), flash, NAND memory, CD-ROM, an optical storage device, a magnetic storage device, etc. The non-transitory computer-readable storage medium, in some examples, may be standalone memory, and may be included in any computing system (e.g., a desktop computer, a laptop computer, a server, a database, etc.).

Figure 5:
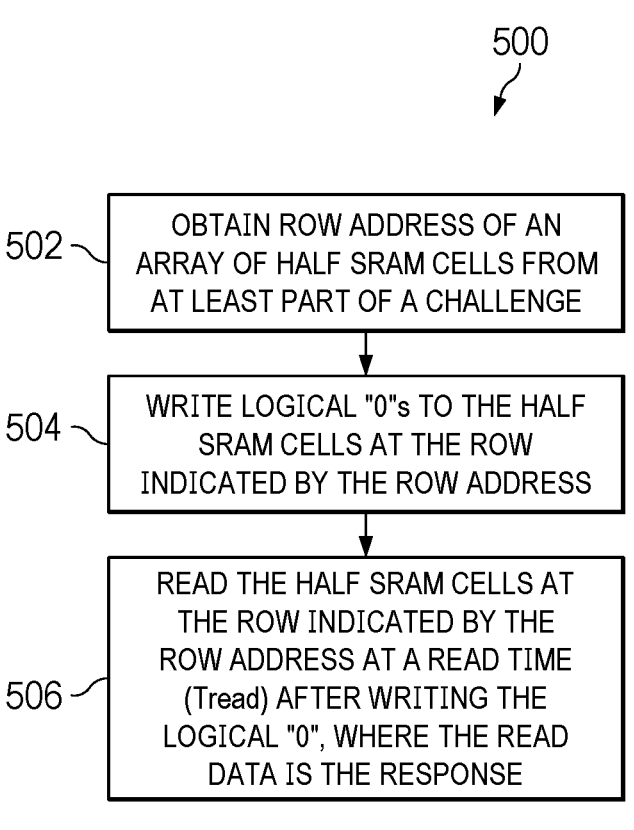
FIG. 5 is a flowchart of a method of using the array of half SRAM cells in FIG. 4 for a PUF operation according to some examples.

The array of half SRAM cells 100 in FIG. 4 may be implemented for a PUF operation. FIG. 5 is a flowchart of a method 500 of using the array of half SRAM cells 100 in FIG. 4 for a PUF operation according to some examples. In this example, writing and reading of a half SRAM cell 100 is in relation to writing and reading the latch node 116 of the half SRAM cell 100 like described above. As indicated previously, the writing and reading of a half SRAM cell 100 may be in relation to writing and reading the complementary latch node 118 of the half SRAM cell 100, in which case, the logical value to be written is inverted (e.g., for reading and writing), and the gate node of the n-type transistor 136 is electrically connected to the complementary latch node 118 (e.g., for reading).

At 502, a row address of the array is obtained from at least part of a challenge. Generally, in the context of a PUF operation, a challenge includes input data to a PUF (e.g., an array of half SRAM cells 100), and in response to the input data being input to the PUF, the PUF outputs unique data as a response. In the array of half SRAM cells 100 of FIG. 4, each row of the array may have a unique data response due to random variation. At 504, logical "0"s are written (e.g., simultaneously) to the half SRAM cells 100 of the array at the row indicated by the row address. At 506, the half SRAM cells 100 of the array at the row indicated by the row address are read (e.g., simultaneously) at a read time (Tread) after writing the logical "0"s, where the read data is the response. The read data is a function of the written logical "0" and the variation, including process variation (and more particularly, PVT variation) of the half SRAM cells 100 (e.g., more particularly, the latch circuits 102 of the half SRAM cells 100) at the row. For a given subset of half SRAM cells 100 of the array (e.g., a row), those half SRAM cells 100 may each have different a different time-to-flip (Tf) and/or together have a unique combination of time-to-flip (Tf) based on the variation, which may result in the read data (e.g., the PUF response) read at the read time (Tread) being unique. Although described in the context of half SRAM cells 100 at a row, the method 500 may be performed with any one or more half SRAM cell 100 using any addressing mechanism.

The read time (Tread) may be based on a distribution of the time-to-flip (Tf) of the half SRAM cells 100 of the array. Selecting a read time (Tread) may be based on a metric of the logical values of the response. In some examples, the metric includes uniformity, uniqueness, or a combination thereof. According to some examples, selecting a read time (Tread) may balance uniformity and uniqueness of available responses of the array of half SRAM cells 100. Uniformity indicates the balance between logical "1"s and logical "0"s in available responses from reading at a given read time (Tread). For perfect uniformity, half of the read bits in the array would be a logical "1" and the other half of the read bits would be a logical "0", which would be indicated by a uniformity of 50%. Uniqueness indicates a bias to responses and may be a measure of a distance (e.g., a Hamming distance) between responses.

A given population of half SRAM cells 100 will have a probability distribution function (PDF) of time-to-flip (Tf) (e.g., indicating the number of half SRAM cells 100 that flip from a logical "0" to a logical "1" at a given time), and that probability distribution function is based, at least in part, on a random variable indicating process variations. In some examples, the read time (Tread) is the time at which the cumulative distribution function (CDF) of the probability distribution function of time-to-flip (Tf) indicates that approximately half of the half SRAM cells 100 have flipped. More simply, in some examples, the read time (Tread) is the time at which approximately half of the half SRAM cells 100 have flipped.

Uniformity and uniqueness may be analytically determined. Uniformity may be determined by the count of flipped half SRAM cells 100 divided by the m number of rows.

$$\text{uniformity} = \frac{1}{m \times n} \sum_{i=1}^{m} \sum_{j=1}^{n} V(\text{RBL\_OUT}_{ij}) > V_F$$

The statement V (RBL_OUT$_{ij}$)>V$_F$ is a Boolean statement, where when true, is 1, and when false, is 0. V (RBL_OUT$_{ij}$) is the voltage on the RBL_OUT of a half SRAM cell 100 at position i row and j column when read. $V_F$ is a flipping voltage, which in some examples, is half of the positive power supply voltage (e.g., $$V_F = \frac{VDD}{2}$$

). An ideal uniformity may be 50%, and in some cases, a uniformity in a range from 48% to 50% may be acceptable. Uniqueness may be determined based on Hamming distances between each pair of responses. Uniqueness may be defined in terms of within-PUF (e.g., within-array) or inter-PUFs (e.g., how different given responses are across the different PUF chips). Within-PUF (or intra-PUF or intra-array) uniqueness can be measured as follows.

$$\text{uniqueness} = \frac{2}{m(m-1)} \sum_{u=1}^{m-1} \sum_{v=u+1}^{m} \frac{HD(R_u, R_v)}{n} \times 100\%$$

HD is the Hamming distance between the response vectors of which the Hamming distance is a function. $R_i$ is a response vector of row i of the array of half SRAM cells 100. The term within the summation (e.g., $$\frac{HD(R_u, R_v)}{n}$$

) represents the normalized Hamming Distance assuming a row represents a response and that the row size is n. The double summation is normalized by the number of evaluated terms, which is $$\frac{m(m-1)}{2}$$

herein (the number of row comparisons with m rows in an array). An ideal uniqueness may be 50%, and in some cases, a uniqueness in a range from 48% to 52% may be acceptable.

Figure 6:
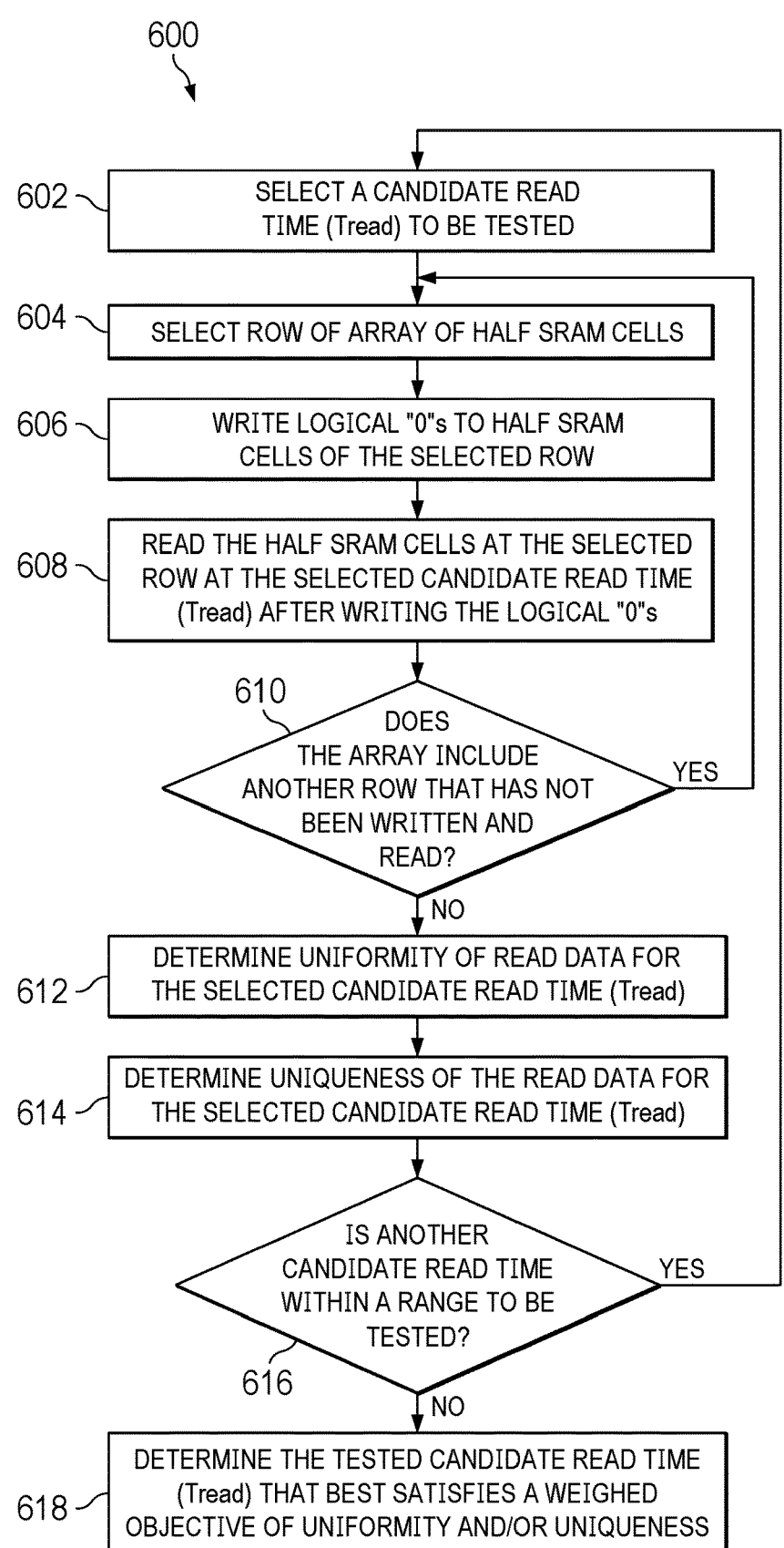
FIG. 6 is a flowchart of a method of determining a read time of the array of half SRAM cells of FIG. 4 for a PUF operation according to some examples.

FIG. 6 is a flowchart of a method 600 of determining a read time (Tread) of the array of half SRAM cells 100 of FIG. 4 for a PUF operation according to some examples. Generally, for a PUF (e.g., the array of half SRAM cells 100), the method 600 tests a plurality of candidate read times by iteratively selecting a candidate read time from the plurality of candidate read times and writing a logical value (e.g., a logical "0") to the half SRAM cells 100 of the array and reading logical values (which may or may not be flipped logical values) from the half SRAM cells 100 of the array at the selected candidate read time after writing the logical value to the half SRAM cells 100. The read and writing may be performed iteratively row by row of the array. For each tested candidate read time, a metric of the read logical values (e.g., uniformity and/or uniqueness) is determined. After testing each candidate read time, a read time is determined from the tested candidate read times based on the metrics corresponding to the tested candidate read times. The determined read time may then be implemented in the method 500 of FIG. 5, for example. The method 600 of FIG. 6 may be for determine a read time (Tread) based on an intra-PUF analysis.

In some examples, the method 600 of FIG. 6 may be performed during manufacturing of a circuit (e.g., integrated circuit on a semiconductor die) that includes the array of half SRAM cells 100, e.g., by using a probe and other test and programming circuitry. The method 600 may be performed across multiple permutations of operating conditions, such as at different operating voltages, different operating temperatures, and combinations thereof. In such examples, a read time (Tread) may be determined for each combination of operating voltage and temperature, and the read times (Tread) and corresponding combinations of operating voltage and temperature are stored in the circuit, such as in a look-up table stored in non-volatile memory. For thereafter implementing the method 500 of FIG. 5, the circuit may obtain the operating voltage and temperature via sensors in the circuit and may use the operating voltage and temperature to look up the corresponding read time (Tread) to be used in the method 500.

In other examples, the method 600 may be performed after the circuit that includes the array of half SRAM cells 100 is deployed. A software routine or module may be executed on the circuit (e.g., by a processor of the circuit) to perform the method 600 to periodically tune the read time (Tread) based on possible changes in environmental conditions. In some circumstances, the order of flipping of half SRAM cells 100 stays the same through changes in operating voltage and temperature. Hence, performing the method 600 in different environmental conditions may recover responses by dynamically determining a read time (Tread) that achieves the same metric(s) (e.g., uniformity and/or uniqueness) as described below. The method 600 may be implemented differently in other applications.

At 602, a candidate read time (Tread) to be tested is selected. A candidate read time (Tread) may be selected from a range of times to be tested. The range may be determined in designing and simulating the circuit. The range may be focused around, with some margin, an expected average time-to-flip (Tf) of the half SRAM cells 100 based on an analytical analysis of the expected process variation from manufacturing the circuit, the operating voltage of the circuit, and the operating temperature of the circuit, or based on data collected from other PUFs implementing an array of half SRAM cells 100. The range may be focused around, with some margin, a nominal time-to-flip (Tf) of any half SRAM cell 100. The range may sweep from 0 to a time at which each half SRAM cell 100 of the array has flipped. As will become clear subsequently, the method 600 iteratively selects a candidate read time (Tread) to be tested at 602. This iterative process may sweep through the range of times to be tested using some time step (e.g., starting at a lower bound of the range and incrementing the candidate read time (Tread) by the time step for each subsequent iteration until an upper bound of the range is reached). In other examples, a binary search or another smart selection technique may be implemented in which a candidate read time (Tread) is selected based on previously tested candidate read times and the resulting uniformities and/or uniqueness. For example, assuming a first tested candidate read time has a first uniformity and/or uniqueness, if a subsequent, second tested candidate read time has a second uniformity and/or uniqueness that is further from 50% than the first uniformity and/or uniqueness, a subsequent, third candidate read time may be selected that is a time between the first tested candidate read time and the second tested candidate read time. In such examples, an initial candidate read time (Tread) may be arbitrarily selected.

At 604, a row of the array of half SRAM cells 100 is selected. As will become clear subsequently, the method 600 iteratively selects a row at 604. A row may be selected based on a sequential stepping through rows through the array of half SRAM cells 100. For example, with reference to FIG. 4, in a first iteration, a row 1 (e.g., corresponding to the RBL_IN1) is selected; in a second iteration, a row 2 (e.g., corresponding to the RBL_IN2) is selected; etc. In other examples, the row may be selected based on any selection technique.

At 606, logical "0"'s are written to the half SRAM cells 100 of the selected row. The writing may be performed as described above. At 608, the half SRAM cells 100 at the selected row are read at the selected candidate read time (Tread) after writing the logical "0"s. The reading may be performed as described above. At 610, a determination is made whether the array of half SRAM cells 100 includes another row that has not been written and read at 606, 608, respectively. If the array does include such a row as determined at 610, the method 600 loops back to 604 to select another row that has not been written and read, and the method 600 iterates over 606, 608.

If the array does not include a row that has not been written and read at 606, 608, as determined at 610, then at 612, the uniformity of the read data for the selected candidate read time (Tread) is determined, and at 614, the uniqueness of the read data for the selected candidate read time (Tread) is determined. Uniformity and uniqueness may be calculated as described above. The determined uniformity and uniqueness may be stored in a table corresponding to the selected candidate read time.

At 616, a determination is made whether another candidate read time is within a range to be tested. If so, the method 600 loops back to 602 to select another candidate read time (Tread) to be tested. If not, at 618, the tested candidate read time (Tread) that best satisfies a weighted objective of uniformity and uniqueness in terms of a target uniformity and/or uniqueness is determined. Once reaching 618, each tested candidate read time (Tread) has a determined uniformity and uniqueness. Hence, the uniformity and/or uniqueness may be used to determine which tested candidate read time (Tread) may be used for a PUF operation. In some examples, the tested candidate read time (Tread) that results in a uniformity and/or uniqueness that is closest to 50% is determined. The determined candidate read time (Tread) may be used as the read time (Tread) in the method 500 of FIG. 5. The read time (Tread) may be written to memory (e.g., non-volatile memory) for subsequent access during operation of the method 500 of FIG. 5.

FIG. 7 is a flowchart of a method 700 of determining a read time (Tread) for multiple arrays of half SRAM cells 100 of FIG. 4 for a PUF operation according to some examples. Generally, for multiple PUFs (e.g., multiple arrays of half SRAM cells 100), the method 700 tests, for each PUF, a plurality of candidate read times by iteratively selecting a candidate read time from the plurality of candidate read times and writing a logical value (e.g., a logical "0") to the half SRAM cells 100 of the array and reading logical values (which may or may not be flipped logical values) from the half SRAM cells 100 of the array at the selected candidate read time after writing the logical value to the half SRAM cells 100. The read and writing may be performed iteratively row by row of the array. For each tested candidate read time and each tested candidate array, a first metric of the read logical values (e.g., uniformity) is determined, and for each tested candidate read time collected over all tested candidate arrays, a second metric of the read logical values (e.g., uniqueness) is determined. After testing each candidate read time and each candidate array, a read time is determined from the tested candidate read times based on the metrics corresponding to the tested candidate read times. The determined read time may then be implemented in the method 500 of FIG. 5 for each tested array of half SRAM cells 100, for example. The method 600 of FIG. 6 may be for determine a read time (Tread) for multiple arrays based on an inter-PUF analysis, such as by analyzing uniqueness between PUFs.

At 702, a candidate read time (Tread) to be tested is selected, like in 602 in FIG. 6. At 704, a candidate array of half SRAM cells 100 to be tested is selected. Each array of half SRAM cells 100 that is a possible candidate for selection may be in a different, e.g., integrated circuit (IC) and/or IC chip or IC die. At 704, a row of the selected array of half SRAM cells 100 is selected, like in 604 of FIG. 6. At 708, logical "0"s are written to the half SRAM cells 100 of the selected row, like in 606 of FIG. 6. At 710, the half SRAM cells 100 at the selected row are read at the selected candidate read time (Tread) after writing the logical "0"s, like in 608 of FIG. 6. At 712, a determination is made whether the array of half SRAM cells 100 includes another row that has not been written and read at 708, 710, respectively. If the array does include such a row as determined at 712, the method 700 loops back to 706 to select another row that has not been written and read, and the method 700 iterates over 708, 710.

If the array does not include a row that has not been written and read at 708, 710, as determined at 712, then at 714, the uniformity of the read data for the selected candidate read time (Tread) is determined, like in 612 of FIG. 6. The uniformity is determined for the selected array of half SRAM cells 100 for the selected read time (Tread). As indicated subsequently, 714 is iterated for each respective selected array of half SRAM cells 100. Hence, each array of half SRAM cells 100 that is analyzed has a corresponding uniformity determined for the selected read time (Tread). The determined uniformity may be stored in a table corresponding to the selected candidate read time and the selected array of half SRAM cells 100.

At 716, a determination is made whether another array of half SRAM cells 100 is to be tested. If another array of half SRAM cells 100 is to be tested as determined at 716, the method 700 loops back to 704 to select another array of half SRAM cells 100 to be tested, and the method 700 iterates over 706, 708, 710, 712, 714.

If no other array of half SRAM cells 100 is to be tested as determined at 716, at 718, the uniqueness of the read data for the selected candidate read time (Tread) is determined. The uniqueness of the read data is determined collectively among all tested arrays of half SRAM cells 100. The determined uniqueness may be stored in a table corresponding to the selected candidate read time.

At 720, a determination is made whether another candidate read time is within a range to be tested. If so, the method 700 loops back to 702 to select another candidate read time (Tread) to be tested. If not, at 722, the tested candidate read time (Tread) (e.g., one tested candidate read time (Tread)) that offers a best balance between uniformity and uniqueness is determined based on the determined uniformities and uniqueness. Once reaching 722, each tested candidate read time (Tread) has a determined uniqueness, and each tested candidate read time (Tread) for each tested candidate array of half SRAM cells 100 has a determined uniformity. Hence, the uniformity and uniqueness may be used to determine which tested candidate read time (Tread) may be used for a PUF operation. The determined read time (Tread) may be the candidate read time (Tread) that provides a desired uniformity and uniqueness (e.g., balances an average uniformity and uniqueness). The determined candidate read time (Tread) may be used as the read time (Tread) in the method 500 of FIG. 5 for each tested array of half SRAM cells 100. The read time (Tread) may be written to memory (e.g., non-volatile memory) for subsequent access during operation of the method 500 of FIG. 5.

Figure 8:
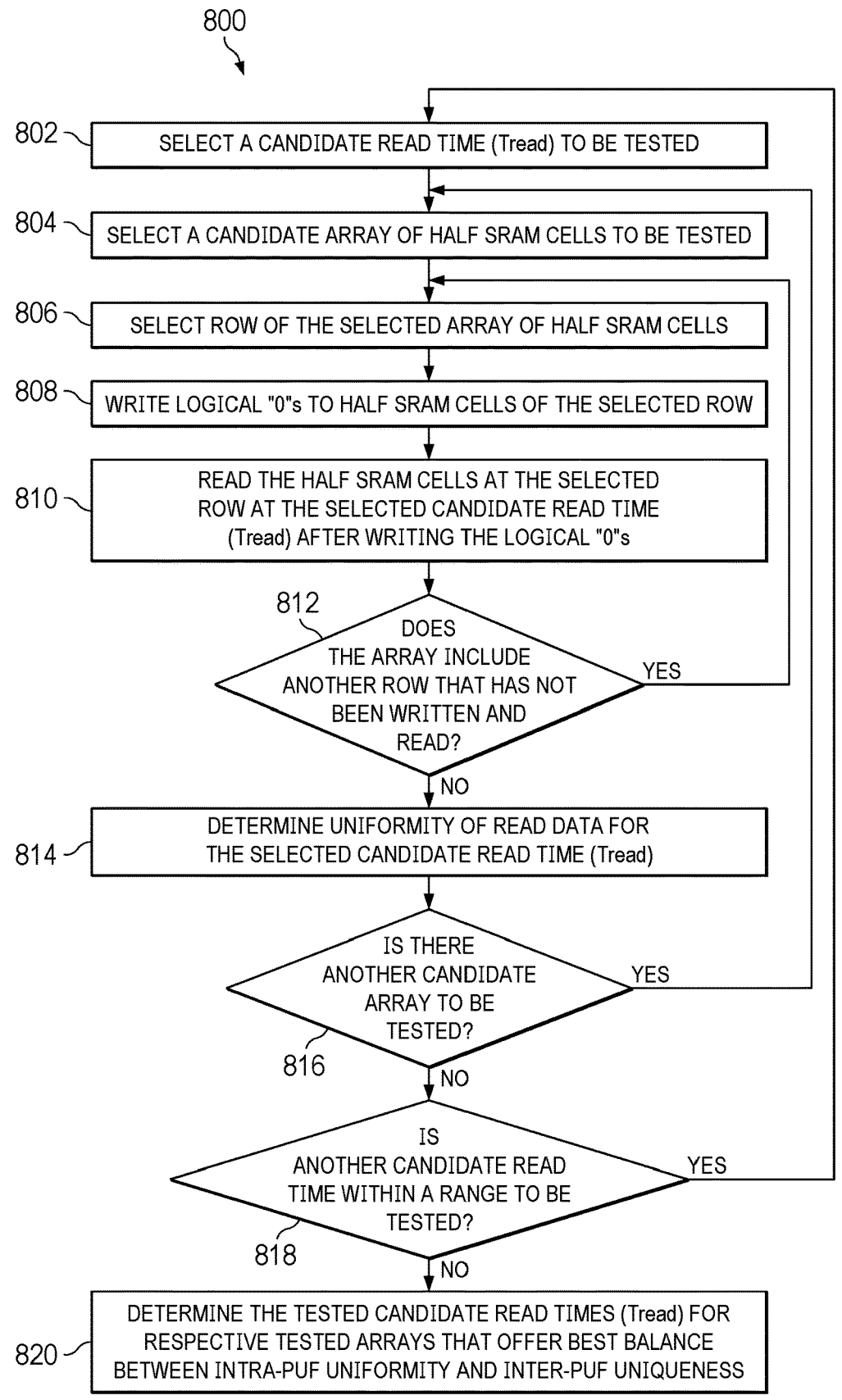
FIG. 8 is a flowchart of a method of determining read times (Tread) for multiple arrays of half SRAM cells of FIG. 4 for a PUF operation according to some examples.

FIG. 8 is a flowchart of a method 800 of determining read times (Tread) for multiple arrays of half SRAM cells 100 of FIG. 4 for a PUF operation according to some examples. Generally, for multiple PUFs (e.g., multiple arrays of half SRAM cells 100), the method 800 tests, for each tested array, a plurality of candidate read times by iteratively selecting a candidate read time from the plurality of candidate read times and writing a logical value (e.g., a logical "0") to the half SRAM cells 100 of the array and reading logical values (which may or may not be flipped logical values) from the half SRAM cells 100 of the array at the selected candidate read time after writing the logical value to the half SRAM cells 100. The read and writing may be performed iteratively row by row of the array. For each tested candidate read time, a first metric of the read logical values (e.g., uniformity) is determined, and a second metric of the collective read logical values (e.g., uniqueness) is determined. After testing each candidate read time and each candidate array, read times for respective tested arrays are determined from the tested candidate read times based on the metrics corresponding to the tested candidate read times. The determined read time may then be implemented in the method 500 of FIG. 5 for each tested array, for example. The method 600 of FIG. 6 may be for determine a respective read time (Tread) for each array of the multiple tested arrays based on an inter-PUF analysis, such as by analyzing uniqueness between PUFs.

At 802, a candidate read time (Tread) to be tested is selected, like in 602 in FIG. 6. At 804, a candidate array of half SRAM cells 100 to be tested is selected. Each array of half SRAM cells 100 that is a possible candidate for selection may be in a different, e.g., integrated circuit (IC) and/or IC chip or IC die. At 804, a row of the selected array of half SRAM cells 100 is selected, like in 604 of FIG. 6. At 808, logical "0"s are written to the half SRAM cells 100 of the selected row, like in 606 of FIG. 6. At 810, the half SRAM cells 100 at the selected row are read at the selected candidate read time (Tread) after writing the logical "0"s, like in 608 of FIG. 6. At 812, a determination is made whether the array of half SRAM cells 100 includes another row that has not been written and read at 808, 810, respectively. If the array does include such a row as determined at 812, the method 800 loops back to 806 to select another row that has not been written and read, and the method 800 iterates over 808, 810.

If the array does not include a row that has not been written and read at 808, 810, as determined at 812, then at 814, the uniformity of the read data for the selected candidate read time (Tread) is determined, like in 612 of FIG. 6. The uniformity is determined for the selected array of half SRAM cells 100 for the selected read time (Tread). As indicated subsequently, 814 is iterated for each respective selected array of half SRAM cells 100. Hence, each array of half SRAM cells 100 that is analyzed has a corresponding uniformity determined for the selected read time (Tread). The determined uniformity may be stored in a table corresponding to the selected candidate read time and the selected array of half SRAM cells 100.

At 816, a determination is made whether another array of half SRAM cells 100 is to be tested. If another array of half SRAM cells 100 is to be tested as determined at 816, the method 800 loops back to 804 to select another row array of half SRAM cells 100 to be tested, and the method 800 iterates over 806, 808, 810, 812, 814.

If no other array of half SRAM cells 100 is to be tested as determined at 816, at 818, a determination is made whether another candidate read time is within a range to be tested. If so, the method 800 loops back to 802 to select another candidate read time (Tread) to be tested. If not, at 820, the tested candidate read times (Tread) for respective arrays of half SRAM cells 100 that offer a best balance between intra-PUF uniformity and inter-PUF uniqueness is determined based on the determined uniformities and analysis of read data read at 808. Once reaching 820, each tested candidate read time (Tread) for each tested candidate array has a determined uniformity. The determination of 820 may select different read times (Tread) based on a desired balance between intra-PUF uniformity and inter-PUF uniqueness (e.g., by balancing the determined uniformity and a resulting inter-PUF uniqueness for the different read times). Since the read times may not be the same across the different tested arrays, the method 800 does not determine a uniqueness for a given candidate read time. Rather, the determination of 820 may implement a higher order analysis which may include uniqueness considering different read times for different tested arrays. The determined candidate read times (Tread) may be used as the respective read time (Tread) in the method 500 of FIG. 5 for a corresponding tested array of half SRAM cells 100. The read time (Tread) may be written to memory (e.g., non-volatile memory) for subsequent access during operation of the method 500 of FIG. 5.

Various operations of the foregoing methods 600, 700, 800 of FIGS. 6, 7, and 8 may be performed in various orders. Some operations may be performed in parallel (e.g., testing different arrays of half SRAM cells 100). Any logical order of operations may be performed in different examples.

Figure 9:
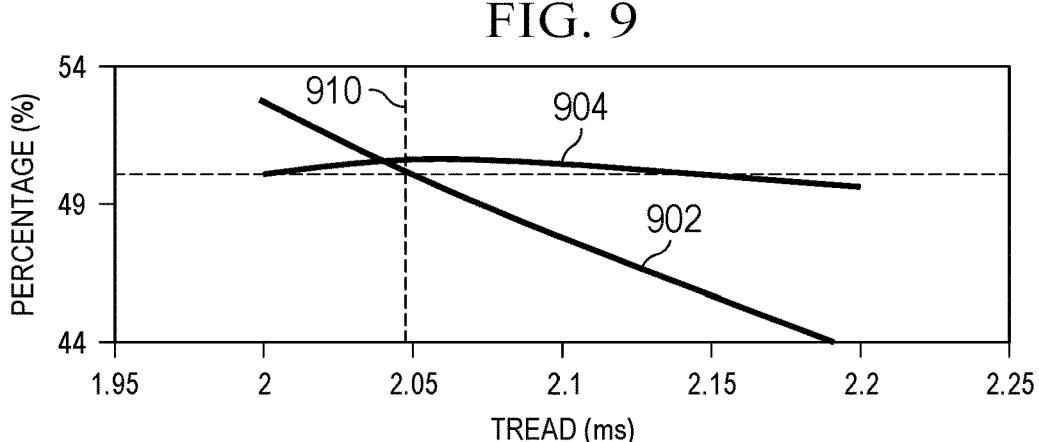
FIGS. 9, 10, and 11 are charts of uniformity and uniqueness determined for arrays of half SRAM cells at different technology nodes according to some examples.
Figure 10:
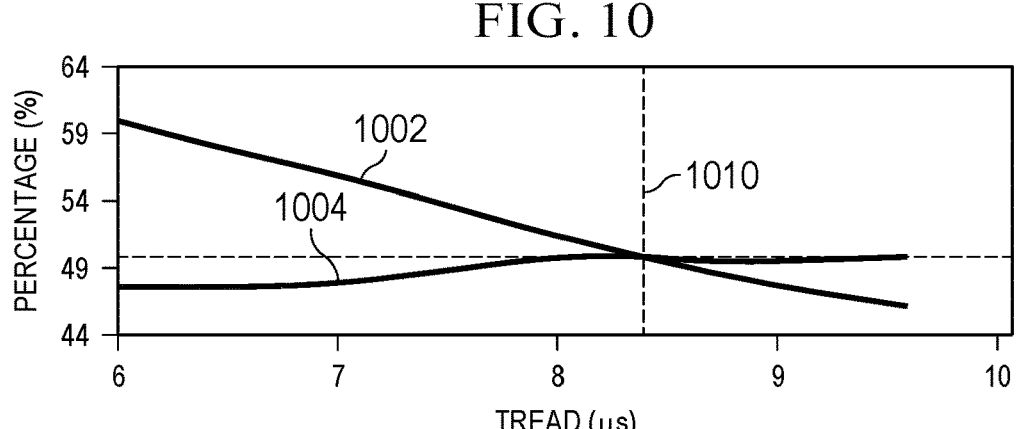
Figure 11:
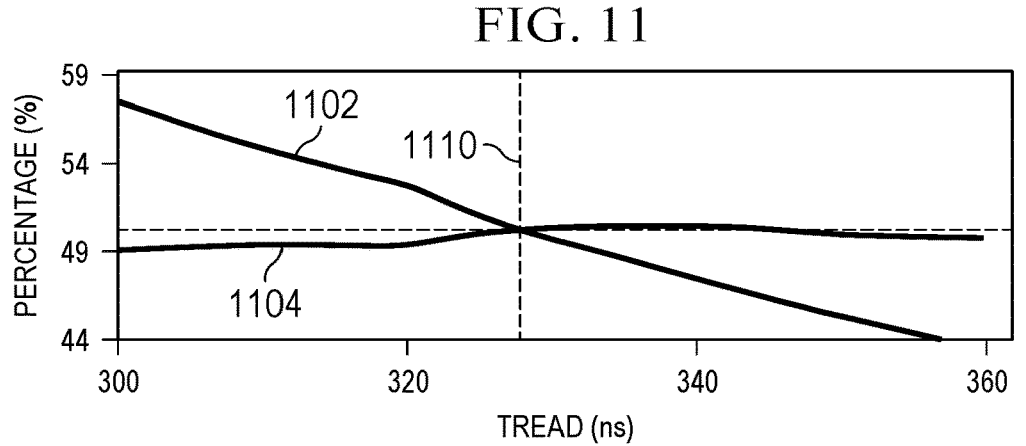

FIGS. 9, 10, and 11 are charts of uniformity and uniqueness determined for arrays of half SRAM cells 100 at different technology nodes according to some examples. The charts of FIGS. 9, 10, and 11 resulted from Monte Carlo simulations mimicking an array having 1000 half SRAM cells. The simulations were run with an operating temperature of 77 K. The read time (Tread) was swept around a nominal time-to-flip (Tf). Each response vector was 100 bits (e.g., the n number of columns of the array was 100), and the number of response vectors was 10 (e.g., the m number of rows of the array was 10). Uniformity and uniqueness were determined as described above. FIG. 9 shows, for a first technology node, a determined uniformity 902 and a determined uniqueness 904 as a function of read time (Tread). A determined read time (Tread) 910 is shown where the determined uniformity 902 is at 50%, which is 2.47 ms. FIG. 10 shows, for a second technology node, a determined uniformity 1002 and a determined uniqueness 1004 as a function of read time (Tread). A determined read time (Tread) 1010 is shown where the determined uniformity 1002 is at 50%, which is 8.38 μs. FIG. 11 shows, for a second technology node, a determined uniformity 1102 and a determined uniqueness 1104 as a function of read time (Tread). A determined read time (Tread) 1110 is shown where the determined uniformity 1102 is at 50%, which is 328 ns.

Figure 12:
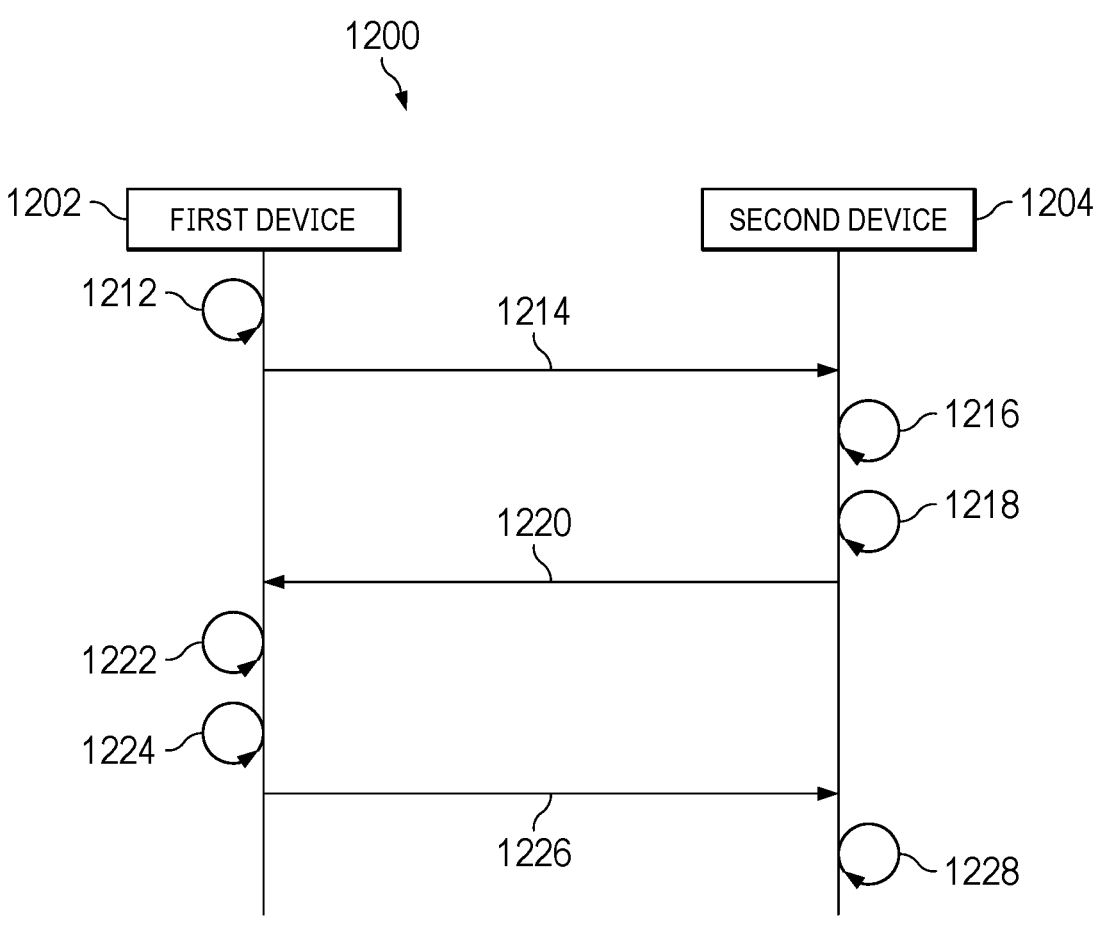
FIG. 12 is a method for encrypted communication using a physical unclonable function (PUF) operation by using an array of half SRAM cells according to some examples.

FIG. 12 is a method 1200 for encrypted communication using a PUF operation by using an array of half SRAM cells 100 according to some examples. The method 1200 is implemented by a first device 1202 and a second device 1204. In some examples, the first device 1202 may be remote from the second device 1204 and may communicate with the second device 1204 via a network, which may include a wired network, a wireless network, or a combination thereof. In some examples, the first device 1202 may be local with the second device 1204, such as in a same electronic package. The first device 1202 and second device 1204 may be in any relative position and may communicate via any appropriate channel.

The second device 1204 includes an array of half SRAM cells 100, such as shown in FIG. 4. The second device 1204 uses the array of half SRAM cells 100 for a PUF operation. The PUF operation uses a row address included in a challenge of a challenge-response pair, and read data read from the row of the array of half SRAM cells 100 indicated by the row address is the response of the PUF operation.

At 1212, the first device 1202 selects a challenge. The first device 1202 may have access to and/or store one or multiple challenge-response pairs from which the challenge is selected. Each challenge includes a row address of a row of the array of half SRAM cells 100, and each corresponding response is expected read data read from the respective row of the array of half SRAM cells 100 indicated by the row address. In some examples, before deploying the second device 1204 to a field application and after determining a read time (Tread) for the array of half SRAM cells 100 of the second device 1204, data is read from each row of the array of half SRAM cells 100 by implementing the read time (Tread), like in FIG. 5. The read data is stored with the corresponding row address as a challenge-response pair in a location accessible to the first device 1202, which may be local on the first device 1202. In such an example, a row address transmitted subsequently from the first device 1202 to the second device 1204 may be implemented as a challenge (e.g., input data) to a PUF operation of the second device 1204, and the read data accessible to the first device 1202 corresponding to the row address would be what the first device 1202 expects the response of the PUF operation to the challenge at the second device 1204 to be. The first device 1202 may select a challenge of any challenge-response pair.

At 1214, the first device 1202 transmits a communication having the selected challenge, and the second device 1204 receives the communication having the selected challenge. At 1216, the second device performs a PUF operation using the received challenge. The PUF operation uses the array of half SRAM cells 100, like described above with respect to FIG. 5. The challenge includes a row address of the array. Logical "0"s are written to the half SRAM cells 100 of the array in the row indicated by the row address. The half SRAM cells 100 in the row indicated by the row address are read at a read time (Tread), and the read data is the response of the PUF operation.

At 1218, the second device 1204 encrypts, using the response of the PUF operation as a cryptography key, data to be communicated. At 1220, the second device 1204 transmits a communication having the encrypted data, and the first device 1202 receives the communication having the encrypted data. At 1222, the first device 1202 decrypts the encrypted data using the expected response of the challenge-response pair corresponding to the selected challenge as a cryptography key. The encryption and decryption may be by any appropriate cryptography technique (e.g., symmetric cryptography).

Similarly, at 1224, the first device 1202 encrypts, using the expected response of the challenge-response pair corresponding to the selected challenge as a cryptography key, data to be communicated. At 1226, the first device 1202 transmits a communication having the encrypted data, and the second device 1204 receives the communication having the encrypted data. At 1228, the second device 1204 decrypts the encrypted data using the response of the PUF operation as a cryptography key. The encryption and decryption may be by any appropriate cryptography technique (e.g., symmetric cryptography).

If the second device 1204 is maintained in environmental conditions in which the read time (Tread) was determined (e.g., as in FIG. 6), the method 1200 of FIG. 12 may be performed without tuning the read time (Tread) or communicating the environmental conditions from the second device 1204 to the first device 1202. If the order of flipping of half SRAM cells 100 is maintained in dynamically changing environmental conditions of the second device 1204, the second device 1204 may perform the method 600 of FIG. 6 to determine a read time (Tread) having a same metric (e.g., uniformity and/or uniqueness) that was obtained to determine the challenge-response pairs to which the first device 1202 has access. In such a situation, the second device 1204 may determine a read time (Tread) that recovers the responses for the challenges. In other scenarios, an error correction code may also be employed in addition to tuning a read time (Tread) for enhanced recovery.

In dynamically changing environmental conditions of the second device 1204 (e.g., when the order of flipping may not be maintained), the first device 1202 may have access to and/or store multiple challenge-response pairs, where any challenge may have multiple responses that correspond to different combinations of operating voltage and temperature. The challenge-response pairs may be maintained in a look-up table indexed, at least in part, based on the environmental conditions (e.g., operating voltage and temperature). In such situations, the method 1200 may include the first device 1202 transmitting a request for environmental conditions to the second device 1204, which the second device 1204 receives. The second device 1204 may, in response, transmit a communication including the environmental conditions (e.g., operating voltage and temperature) of the second device 1204 to the first device 1202, which the first device 1202 receives. In some examples, the first device 1202 may select a challenge at 1212 based on the received environmental conditions. Hence, in such examples, the request and communication in response to the request are communicated before 1212. In some examples, the first device 1202 may select a challenge at 1212 without being aware of the environmental conditions of the second device 1204, and may receive the environmental conditions prior to decrypting the data at 1222 and/or encrypting the data at 1224. Once the first device 1202 receives the environmental conditions, the first device 1202 may determine the expected response (and hence, the challenge-response pair) based on the challenge that was transmitted at 1214 and the received environmental conditions.

The encrypted communication using a PUF operation of FIG. 12 may provide a level of security of communication. No cryptography key is communicated between the first device 1202 and second device 1204. Hence, no key that may be used to crack encryption may be intercepted by a hostile party from a communication between the first device 1202 and second device 1204. This may cause cracking encrypted communication being more difficult, and encrypted communication may be more secure.

Referring back to FIG. 4, the half SRAM cell 100 may be biased to store a logical "1" on the latch node 116 (e.g., and a logical "0" on the complementary latch node 118) at room or higher temperature and/or at high voltage operation. Hence, a read transistor (e.g., the n-type transistor 136) having a gate node electrically connected to the latch node 116 will provide a low voltage on RBL_OUT upon being read, and a read transistor having a gate node electrically connected to the complementary latch node 118 will provide a high voltage on RBL_OUT upon being read. A half SRAM cell 100 may experience appreciable leakage at room or higher temperature and/or at high voltage operation, which may result in fast flip and may favor, upon initialization, the latch node 116 being pulled up to a logical "1" by the p-type transistor 112 and the complementary latch node 118 being pulled down to a logical "0" by the n-type transistor 114. In such conditions, half SRAM cells 100 (e.g., in an array like in FIG. 4) may be used as pad data blocks by using address remapping. For example, this may be helpful in machine learning applications involving images that must be padded with zeros or ones to match the neural network architecture or enable processing. In such case, the gate node of the n-type transistor 136 may be electrically connected to the complementary latch node 118 if the logical "0" is to be used and read for the pad data, or the gate node of the n-type transistor 136 may be electrically connected to the latch node 116 if the logical "1" is to be used and read for the pad data. Using the half SRAM cells 100 for pad data may be done without any additional writing of the half SRAM cells 100, which may avoid a write delay and/or write energy. Using such pad data in proximity to or embedded within a stored key (e.g., read data that is a response to a challenge) may further obscure the key from a hostile party that does not know the physical address of the key bits, which may provide additional security for the key.

Figure 13:
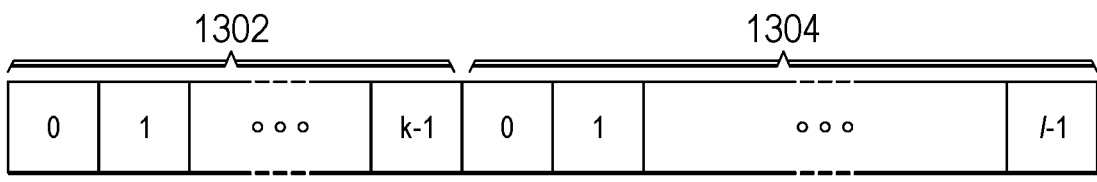
FIGS. 13 and 14 illustrate pad data appended to data according to some examples.
Figure 14:
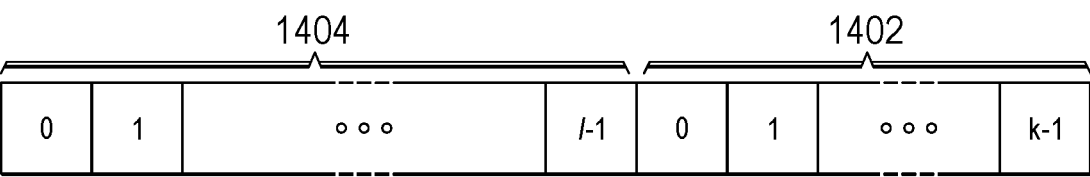

FIGS. 13 and 14 illustrate pad data appended to data according to some examples. FIG. 13 shows k bits of pad data 1302 generated by using the array of half SRAM cells 100 prepended to/bits of underlying data 1304. FIG. 14 shows k bits of pad data 1402 generated by using the array of half SRAM cells 100 postpended to/bits of underlying data 1404. The pad data 1302, 1402 may be appended by remapping the address of the half SRAM cells 100. The remapped half SRAM cells 100 may be any selected subset (e.g., any selected row) of the array of half SRAM cells 100.

A computer system (such as computer system 1500 of FIG. 15) is an example device (e.g., the first device 1202 or the second device 1204) that may be configured to perform, at least in part, any methodology described herein. A storage subsystem of a computer system may be used to store the programs, software routines or modules, and data structures that are used to perform methodologies described herein.

Figure 15:
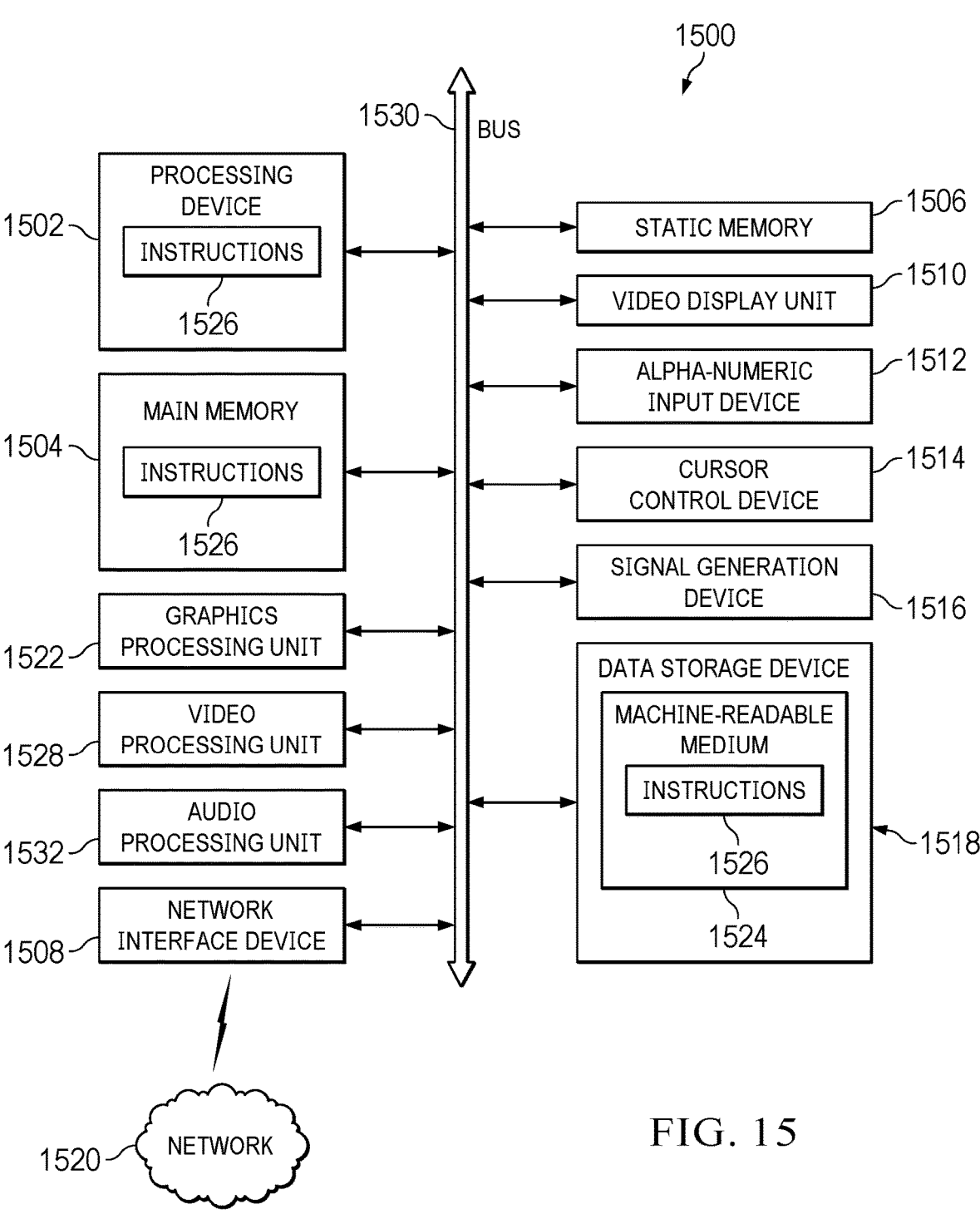
FIG. 15 depicts a diagram of an example computer system in which embodiments of the present disclosure may operate.

FIG. 15 illustrates an example machine of a computer system 1500 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1500 includes a processing device 1502, a main memory 1504 (e.g., read-only memory (ROM), flash memory, dynamic random access memory (DRAM) such as synchronous DRAM (SDRAM), a static memory 1506 (e.g., flash memory, static random access memory (SRAM), etc.), and a data storage device 1518, which communicate with each other via a bus 1530.

Processing device 1502 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1502 may also be one or more special-purpose processing devices such as an application specific integrated circuit (ASIC), a field programmable gate array (FPGA), a digital signal processor (DSP), network processor, or the like. The processing device 1502 may be configured to execute instructions 1526 for performing the operations and steps described herein.

In some examples, the processing device 1502 includes an array of half SRAM cells 100 like shown in FIG. 4. The processing device 1502 may control operations to initiate the performance of the method 500 of FIG. 5 using the array of SRAM cells. Furthermore, the processing device 1502 (including the array of half SRAM cells 100) may control operations to dynamically tune a read time (Tread) by implementing the method 600 of FIG. 6. In some examples, the processing device 1502 may control operations to initiate data encryption and decryption as described with respect to FIG. 12.

In some examples, the computer system 1500 is separate from an array of half SRAM cells 100 and may be communicatively coupled to the array of half SRAM cells 100. In such examples, the processing device 1502 may control operations to implement the method 600 of FIG. 6 to determine a read time (Tread) for the array of half SRAM cells 100 to implement a PUF.

The computer system 1500 may further include a network interface device 1508 to communicate over the network 1520. The computer system 1500 also may include a video display unit 1510 (e.g., a liquid crystal display (LCD) or a cathode ray tube (CRT)), an alphanumeric input device 1512 (e.g., a keyboard), a cursor control device 1514 (e.g., a mouse), a graphics processing unit 1522, a signal generation device 1516 (e.g., a speaker), graphics processing unit 1522, video processing unit 1528, and audio processing unit 1532.

The data storage device 1518 may include a machine-readable storage medium 1524 (also known as a non-transitory computer-readable storage medium) on which is stored one or more sets of instructions 1526 or software embodying any one or more of the methodologies or functions described herein. The instructions 1526 may also reside, completely or at least partially, within the main memory 1504 and/or within the processing device 1502 during execution thereof by the computer system 1500, the main memory 1504 and the processing device 1502 also constituting machine-readable storage media.

In some implementations, the instructions 1526 include instructions to implement functionality corresponding to the present disclosure. While the machine-readable storage medium 1524 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1502 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a non-transitory computer-readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable storage medium having stored thereon instructions, which may be used to program a computer system (or other electronic devices) to perform a process according to the present disclosure. A machine-readable storage medium includes any mechanism for storing information in a form readable by a machine (e.g., a computer). For example, a machine-readable (e.g., a computer-readable) storage medium includes a machine-readable (e.g., a computer-readable) storage medium such as a read only memory (ROM), random access memory (RAM), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
   writing a first logical value to a latch node of a latch circuit of a half static random access memory (SRAM) cell, the latch circuit being non-inverter-based, the latch circuit including:
   a p-type transistor; and
   an n-type transistor, wherein:
      a drain node of the p-type transistor is electrically connected to a gate node of the n-type transistor as a first node; and
      a drain node of the n-type transistor is electrically connected to a gate node of the p-type transistor as a second node, the latch circuit being configured to maintain the first node and the second node at logically complementary voltages; and
   reading a second logical value from the latch node.

2. The method of claim 1, wherein:
   the latch node is the first node.

3. The method of claim 1, wherein:
   the latch node is the second node.

4. The method of claim 1, wherein reading the second logical value from the latch node includes:
   maintaining a read bit line in node at a high voltage, a first source/drain node of a read access transistor being electrically connected to the read bit line in node, a gate node of the read access transistor being electrically connected to the latch node;
   pre-charging a read bit line out node, a second source/drain node of the read access transistor being electrically connected to the read bit line out node;
   pulling a voltage of the read bit line in node down to a low voltage; and
   capturing a voltage of the read bit line out node as a read value when the voltage of the read bit line in node is pulled down to the low voltage, the read value corresponding to the second logical value.

5. The method of claim 1, wherein writing the first logical value to the latch node includes passing the first logical value through a pass gate transistor, wherein:
   a first source/drain node of the pass gate transistor is electrically connected to a bit line node;
   a second source/drain node of the pass gate transistor is electrically connected to the latch node; and

a gate node of the pass gate transistor is electrically connected to a word line node.

6. The method of claim 1, wherein:

writing the first logical value includes writing the first logical value to latch nodes of respective latch circuits of half SRAM cells, each half SRAM cell of the half SRAM cells being an instance of the half SRAM cell; and reading the second logical value includes reading respective second logical values from the respective latch nodes at a read time after writing the first logical value to the latch nodes, the second logical values each being a function of a random variation of the respective latch circuit and the first logical value, the random variation including process variation.

7. The method of claim 6 further comprising encrypting data using a cryptography key, the cryptography key being based on the read second logical values.

8. The method of claim 6 further comprising:

receiving encrypted data; and decrypting the encrypted data using a cryptography key, the cryptography key being based on the read second logical values.

9. The method of claim 6 further comprising determining the read time based on a metric of the second logical values, wherein the metric includes a target uniformity, a target uniqueness, or a combination thereof.

10. The method of claim 1 further comprising obtaining a challenge, the challenge including an indication of a row address of a row of an array of half SRAM cells, each half SRAM cell of the array of half SRAM cells being an instance of the half SRAM cell, wherein:

writing the first logical value includes writing the first logical value to latch nodes of respective latch circuits of half SRAM cells in the row indicated by the row address; and reading the second logical value includes reading respective second logical values from the respective latch nodes of the respective latch circuits of the half SRAM cells in the row indicated by the row address at a read time after writing the first logical value to the latch nodes, the second logical values each being a function of a random variation of the respective latch circuit and the first logical value, the random variation including process variation, wherein the second logical values are a response to the challenge.

11. The method of claim 10 further comprising encrypting data using a cryptography key, the cryptography key being based on the response to the challenge.

12. The method of claim 1, further comprising:

for each candidate read time of a plurality of candidate read times, determining a metric of respective second logical values for the respective candidate read time, wherein:

for the respective candidate read time:

writing the first logical value includes writing the first logical value to latch nodes of respective latch circuits of half SRAM cells, each half SRAM cell of the half SRAM cells being an instance of the half SRAM cell; and reading the second logical value includes reading the respective second logical values from the latch nodes at the respective candidate read time after writing the first logical value to the latch nodes; and determining a read time from the candidate read times based on the respective metrics.

13. The method of claim 12, wherein the second logical values are respective functions of process, voltage, and temperature (PVT) variation of the latch circuits and the first logical value.

14. The method of claim 12, wherein determining the metric of the second logical values for the respective candidate read time includes determining a uniformity of the second logical values for the respective candidate read time.

15. The method of claim 12, wherein determining the metric of the second logical values for the respective candidate read time includes determining a uniqueness of the second logical values for the respective candidate read time.

16. A non-transitory storage medium storing an electronic representation of a circuit design, the circuit design comprising:

a half static random access memory (SRAM) cell including a latch circuit, the latch circuit being non-inverter-based, the latch circuit including:

a p-type transistor; and an n-type transistor, wherein:

a drain node of the p-type transistor is electrically connected to a gate node of the n-type transistor as a first node; and a drain node of the n-type transistor is electrically connected to a gate node of the p-type transistor as a second node, the latch circuit being configured to maintain the first node and the second node at logically complementary voltages.

17. The non-transitory storage medium of claim 16, wherein the half SRAM cell further includes a first pass gate transistor and a second pass gate transistor, wherein:

a first source/drain node of the first pass gate transistor is electrically connected to a bit line node;

a second source/drain node of the first pass gate transistor is electrically connected to the first node;

a gate node of the first pass gate transistor is electrically connected to a word line node;

a first source/drain node of the second pass gate transistor is electrically connected to a complementary bit line node;

a second source/drain node of the second pass gate transistor is electrically connected to the second node; and a gate node of the second pass gate transistor is electrically connected to the word line node.

18. The non-transitory storage medium of claim 16, wherein the half SRAM cell further includes a read access transistor, wherein:

a first source/drain node of the read access transistor is electrically connected to a read bit line in node;

a second source/drain node of the read access transistor is electrically connected to a read bit line out node; and a gate node of the read access transistor is electrically connected to the first node.

19. The non-transitory storage medium of claim 16, wherein the half SRAM cell further includes a read access transistor, wherein:

a first source/drain node of the read access transistor is electrically connected to a read bit line in node;

a second source/drain node of the read access transistor is electrically connected to a read bit line out node; and a gate node of the read access transistor is electrically connected to the second node.

20. A method comprising:

writing a first logical value to a latch node of a latch circuit of a half static random access memory (SRAM) cell, the latch circuit being non-inverter-based, the latch circuit consists of:                                     5 a p-type transistor; and an n-type transistor, wherein:

a source node of the p-type transistor is electrically connected to a first power supply node;

a drain node of the p-type transistor is electrically 10 connected to a gate node of the n-type transistor;

a drain node of the n-type transistor is electrically connected to a gate node of the p-type transistor; and a source node of the n-type transistor is electrically 15 connected to a second power supply node; and reading a second logical value from the latch node.

\* \* \* \* \*